(12) United States Patent
Simon

(10) Patent No.: US 11,876,035 B2
(45) Date of Patent: Jan. 16, 2024

(54) LIQUID-COOLED CHIP

(71) Applicant: Commissariat à l'Energie Atomique et aux Energies Alternatives, Paris (FR)

(72) Inventor: Gilles Simon, Grenbole (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 294 days.

(21) Appl. No.: 17/249,892

(22) Filed: Mar. 17, 2021

(65) Prior Publication Data

US 2021/0296209 A1  Sep. 23, 2021

(30) Foreign Application Priority Data

Mar. 19, 2020 (FR) ...................................... 2002710

(51) Int. Cl.
*H01L 23/473* (2006.01)
*H01L 21/48* (2006.01)

(52) U.S. Cl.
CPC ........ *H01L 23/473* (2013.01); *H01L 21/4882* (2013.01)

(58) Field of Classification Search
CPC .............................. H01L 23/46; H01L 23/473
See application file for complete search history.

(56) References Cited

U.S. PATENT DOCUMENTS

| 7,265,976 | B1 | 9/2007 | Knight |
| 9,431,316 | B2 | 8/2016 | Pagaila |

| 2004/0113265 | A1 | 6/2004 | DiBattista et al. |
| 2005/0139996 | A1 | 6/2005 | Myers et al. |
| 2006/0131733 | A1* | 6/2006 | Mongia ................. H01L 23/473 257/E23.098 |
| 2006/0160327 | A1 | 7/2006 | Barna |
| 2007/0025082 | A1* | 2/2007 | Lee ...................... H01L 23/3677 257/E23.098 |
| 2017/0263532 | A1* | 9/2017 | Fukuoka ............... H01L 23/467 |
| 2018/0025962 | A1* | 1/2018 | Dede .................... H01L 29/2003 257/712 |
| 2020/0105644 | A1* | 4/2020 | Teng ................... H01L 23/3677 |
| 2020/0273777 | A1* | 8/2020 | Jain ....................... H01L 21/565 |
| 2021/0398878 | A1* | 12/2021 | Choobineh ......... H01L 23/3672 |

FOREIGN PATENT DOCUMENTS

| EP | 1465252 | A1 | 10/2004 |
| EP | 1739746 | A2 | 1/2007 |
| JP | H01206634 | A | 8/1989 |
| JP | H04122054 | A | 4/1992 |
| WO | 2005104323 | A2 | 11/2005 |

OTHER PUBLICATIONS

Preliminary Search Report for French Application No. 2002710 dated Dec. 7, 2020, 2 pages.

* cited by examiner

*Primary Examiner* — Benjamin P Sandvik
(74) *Attorney, Agent, or Firm* — Moreno IP Law LLC

(57) ABSTRACT

The present description concerns an electronic chip (202) formed on top and inside of a semiconductor substrate including, one the side of a first surface (202B), at least one active component and, on the side of a second surface (202T) opposite to the first surface, at least one channel for the circulation of a liquid intended to cool the chip.

14 Claims, 8 Drawing Sheets

LIQUID-COOLED CHIP

FIELD

The present disclosure generally concerns electronic devices and, more particularly, electronic chips intended to be cooled by the circulation of a liquid.

BACKGROUND

In devices such as supercomputers, computer servers or power modules, chips generally operating at high frequency and capable of conducting intense electric currents (in the order of from one ampere to some ten amperes) are used. This often results in unwanted significant heat emissions. It is then desired to evacuate this heat, to maintain the chips within adequate operating temperature ranges. For this purpose, each chip is typically equipped with a heat sink intended to exchange, with a heat-transfer fluid, part of the thermal energy emitted by the chip.

The sink is however generally separated from the chip by at least one interface layer. In fields such as high-performance computing, where there is a need to dissipate ever-increasing thermal powers, the heat resistance of this interface layer adversely affects heat exchanges between the chip and the heat-transfer fluid. This accordingly degrades the efficiency of chip cooling by the sink.

SUMMARY

There is a need to improve the cooling of current electronic chips.

An embodiment overcomes all or part of the disadvantages of known electronic chips.

An embodiment provides an electronic chip formed inside and on top of a semiconductor substrate comprising, on the side of a first surface, at least one active component and, on the side of a second surface opposite to the first surface, at least one first channel for the circulation of a liquid intended to cool the chip.

According to an embodiment, each first channel is defined by a recess from the second surface of the substrate.

According to an embodiment, each recess has the shape of a straight groove opened on the side of the second surface of the substrate.

According to an embodiment, the bottom of each groove is separated from the first surface of the substrate by a distance in the range from 20 µm to 250 µm, preferably from 20 µm to 40 µm.

According to an embodiment, the first channel has, in top view, a coil shape.

According to an embodiment, each recess has the shape of a disk sector laterally bordered with two radial fins.

An embodiment provides an electronic device comprising:
a chip such as described; and
a cover located opposite the second surface of the substrate.

According to an embodiment, the cover forms a space for distributing the liquid into each channel.

According to an embodiment, the cover comprises a liquid injection port and a liquid discharge port.

According to an embodiment, each first channel has a first end located close to the liquid injection port and a second end located close to the liquid discharge port.

According to an embodiment, the liquid injection port and the liquid discharge port form, with respect to a normal to the upper surface of the cover, an angle in the range from 45° to 70°.

According to an embodiment, the chip is surrounded, on all its lateral surfaces, with a block made of an organic material, preferably, epoxy resin.

According to an embodiment, the block comprises at least one second liquid circulation channel.

According to an embodiment, the cover is made of an organic material, preferably, epoxy resin.

An embodiment provides a method of manufacturing a device such as described, comprising the steps of:
depositing an oxide layer on the second surface of the substrate;
etching the oxide layer;
forming the first circulation channel vertically in line with a portion of the second surface of the substrate which is not coated with the oxide layer; and
bonding the cover opposite the second surface of the substrate.

According to an embodiment, the first circulation channel is formed by reactive ion etching.

BRIEF DESCRIPTION OF THE DRAWINGS

The foregoing and other features and advantages of the present invention will be discussed in detail in the following non-limiting description of specific embodiments and implementation modes in connection with the accompanying drawings, in which.

DETAILED DESCRIPTION OF THE PRESENT EMBODIMENTS

Figure 1:
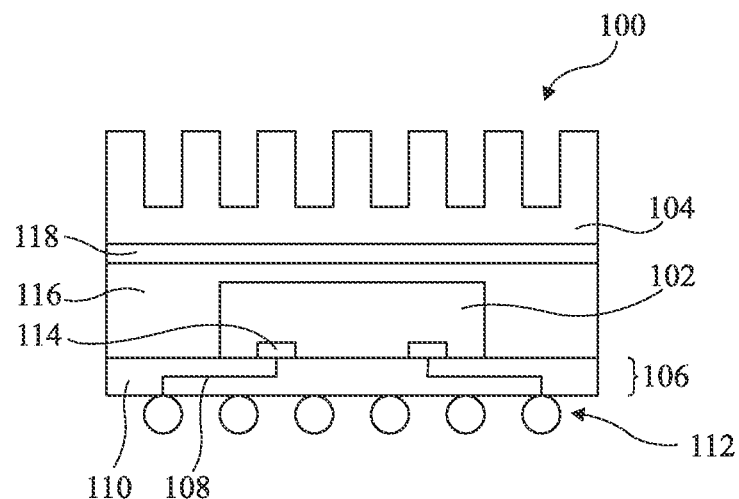
FIG. 1 is a partial simplified cross-section view illustrating an example of a device comprising an electronic chip equipped with a heat sink.

Like features have been designated by like references in the various figures. In particular, the structural and/or functional elements common to the different embodiments and implementation modes may be designated with the same reference numerals and may have identical structural, dimensional, and material properties.

For clarity, only those steps and elements which are useful to the understanding of the described embodiments and implementation modes have been shown and will be detailed. In particular, the electronic components integrated to the described chips will not be detailed, the described embodiments and implementation modes being compatible with the electronic components usually integrated to chips.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

Unless specified otherwise, the expressions "around", "approximately", "substantially" and "in the order of" signify within 10%, and preferably within 5%.

FIG. 1 is a partial simplified cross-section view illustrating an example of a device 100 comprising an electronic chip 102 equipped with a heat sink 104.

In the example illustrated in FIG. 1, chip 102 is coupled, on its lower surface side, to an interconnection structure 106. Interconnection structure 106 typically comprises a stack of layers made of an electrically-conductive material 108, for example, a metal, separated by layers made of an electrically-insulating material 110. An array 112 of solder balls, located on the lower surface side of interconnection structure 106, enables to electrically connect and to bond device 100 to a support (not shown), for example, a printed circuit board.

Structure 106 ensures, in particular, a function of electric connection between connection pads 114 of chip 102 and the solder balls of array 112. Advantage is further taken of interconnections structure 106 and of solder ball array 112 to form a connection surface area of chip 102 greater than that which could be obtained by only using connection pads 114. The electric connection between chip 102 and the printed circuit board is thus eased and made more reliable.

In the shown example, the lateral surfaces and the upper surface of chip 102 are surrounded with an encapsulation block 116, formed on the upper surface side of interconnection structure 106. In the case where active components (not shown), for example, transistors, have been formed on the lower surface side of chip 102, encapsulation block 116 particularly enables to protect these components against environmental factors, such as a direct exposure to humidity.

In FIG. 1, the upper surface of encapsulation block 116 is coated with an interface layer 118 between block 116 and heat sink 104. Layer 118 is usually made of a so-called thermal interface material, that is, a material enabling to obtain a good thermal coupling between block 116 and sink 104. In certain cases, interface layer 118 may directly coat the upper surface of chip 102, the upper surface of chip 102 then being flush with the upper surface of block 116.

The material of interface layer 118 generally has a thermal resistance much smaller than that of the material of encapsulation block 116, without however reaching an optimal value since it should in particular satisfy planarization, adhesiveness, cost, and ease-of-implementation needs. In the shown example where the upper surface of chip 102 is separated from interface layer 118 by a portion of encapsulation block 116, the thermal resistance of the material of encapsulation block 116 adversely affects the discharge, towards heat sink 104, of the heat generated by chip 102 during its operation. This accordingly degrades the efficiency of the cooling of the chip 102 of device 100 by heat sink 104.

Another disadvantage of device 100 lies in the fact that chip 102 is separated from sink 104 by a plurality of interfaces between distinct materials. In the shown example, device 100 more particularly comprises three interfaces between chip 102 and sink 104:

an interface between the upper surface of chip 102 and encapsulation block 116;

another interface between the upper surface of block 116 and the lower surface of layer 118; and still another interface between the upper surface of layer 118 and the lower surface of sink 104.

Each of these interfaces tends to degrade the efficiency of the cooling of the chip 102 of device 100 by sink 104.

Figure 2:
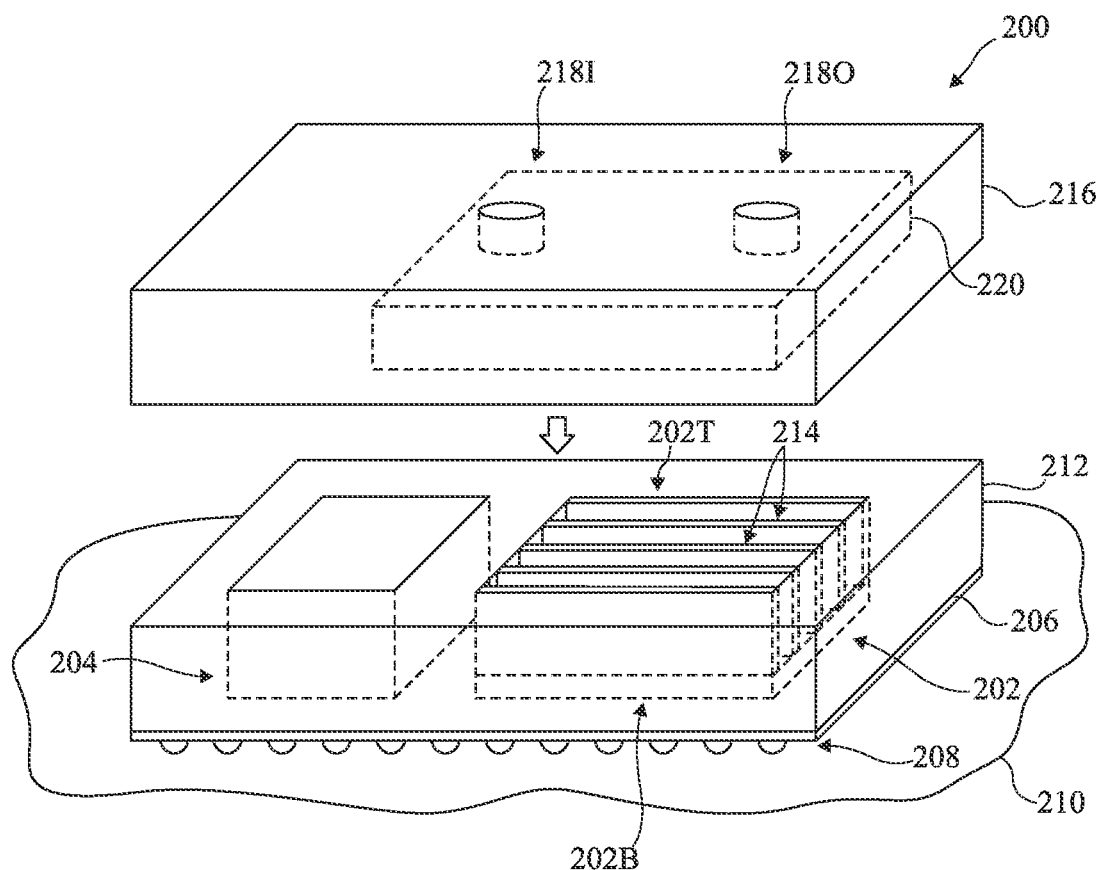
FIG. 2 is a partial simplified perspective view illustrating an embodiment of an electronic device intended to be cooled by the circulation of a liquid.

FIG. 2 is a partial simplified perspective view illustrating an embodiment of an electronic device 200 intended to be cooled by the circulation of a liquid.

Device 200 comprises two electronic chips 202 and 204. As an example, electronic chip 202 is a microprocessor and electronic chip 204 is a memory. Chips 202 and 204 for example form part of a device 200 of system-in-package (SiP) type.

Electronic chips 202 and 204 are connected, via a same interconnection structure 206, to an array 208 of solder balls. The interconnection structure 206 of the device 200 of FIG. 2 for example similar to the interconnection structure 106 of the device 100 of FIG. 1.

The interconnection structure 206 and the array 208 of solder balls of device 200 enable, in particular, to connect pads (not shown) of chips 202 and 204 to contacting elements (not shown) formed at the surface of a support 210, for example, a printed circuit board, located under solder ball array 208. Interconnection structure 206 may further enable to interconnect pads of chip 202 and pads of chip 204 without passing through printed circuit board 210.

It is considered, in the orientation of FIG. 2, that chip 202 has a lower surface or first surface 202B comprising at least one active electronic component such as a transistor or a diode. Surface 202B is then called active surface of chip 202.

In the following description, it is considered that the components formed on the side of the active surface 202B of chip 202 cause a heat emission during the operation of chip 202. It is assumed that it is desired to discharge this heat in order to cool chip 202.

Chips 202 and 204 are surrounded, on their respective lateral surfaces, by an encapsulation block 212 made of an organic material, for example, epoxy resin. Encapsulation block 212 particularly enables to protect the active surface 202B of chip 202 against humidity.

Chip 202 further has an upper surface or second surface 202T, opposite to active surface 202B. According to an embodiment, surface 202T of chip 202 comprises recesses 214. In other words, chip 202 comprises, on the side of surface 202T, fins separated from one another by recesses 214. The recesses 214 shown in FIG. 2 have the shape of straight grooves. Recesses 214 form channels for the circulation of a heat-transfer liquid, for example, water, intended to cool chip 202 during the operation thereof.

Groove-shaped recesses 214 are open on the side of surface 202T and are preferably substantially parallel to one another. Recesses 214 preferably have identical dimensions (to within manufacturing dispersions).

A cover 216 is bonded to the upper surface of the encapsulation block 212 of chips 202 and 204. Cover 216 comprises a liquid inlet or injection port 218I and another liquid outlet or discharge port 218O.

Cover 216 further comprises a cavity 220, located opposite recesses 214, having portions 218I and 218O emerging into it. Cavity 220 forms a space or volume for distributing the liquid into the circulation channels of chip 202 formed by recesses 214.

An advantage of device 200 lies in the fact that channels 214, located on the side of the upper surface 202T of chip 202 are intended to be placed in direct contact with the heat-transfer liquid. In device 200, the fins delimiting the channels 214 of chip 202 thus play the role of a heat sink. This enables to improve the efficiency of the cooling of chip 202, particularly as compared with a structure similar to that of device 100 (FIG. 1) where at least one layer is interposed between the chip and the heat-transfer liquid.

Another advantage of device 200 lies in the fact that the presence of recesses 214 enables to benefit, on the side of upper surface 202T of chip 202, from an exchange surface area larger than that which would be obtained without recesses 214. This enables to further improve the efficiency of the cooling of chip 202.

Figure 3:
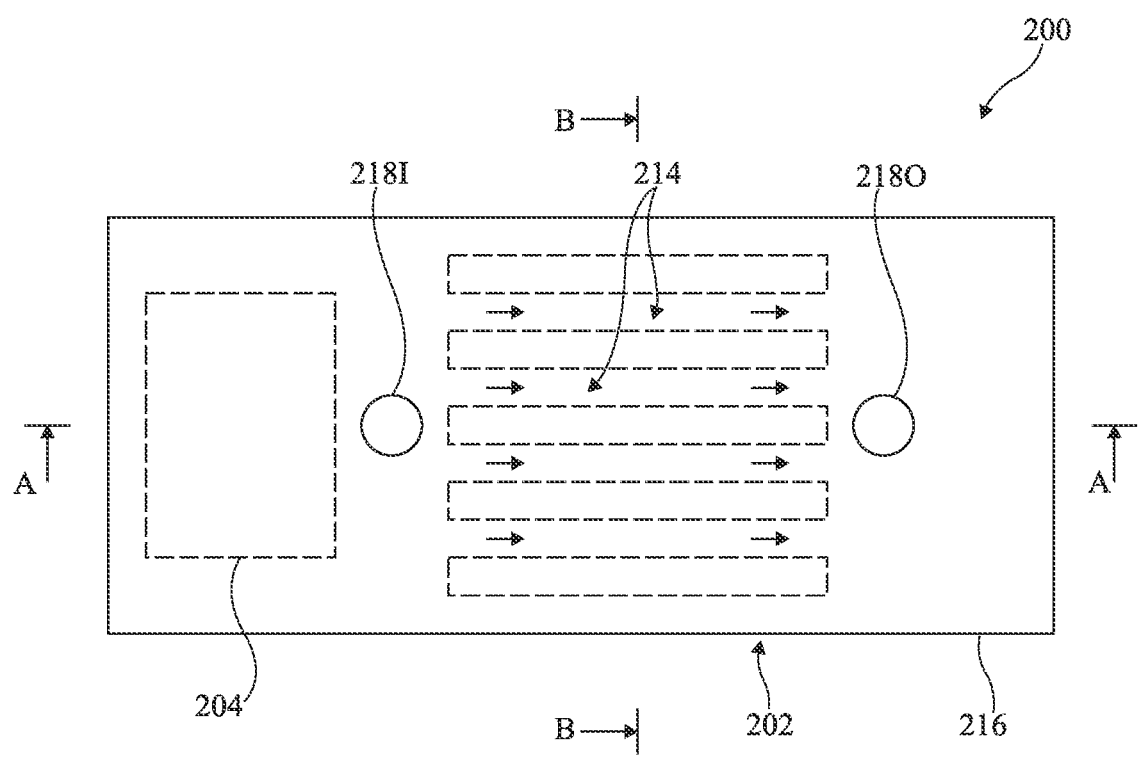
FIG. 3 is a partial simplified top view of the device of FIG. 2.

FIG. 3 is a partial simplified top view of the device 200 of FIG. 2.

In the shown example, liquid injection port 218I is located close to an end of the recesses 214 of chip 202, while liquid outlet port 218O is located close to the other end of the recesses 214 of chip 202. This enables to conduct the liquid all along the length of recesses 214 and thus to optimize heat exchanges between the chip 202 to be cooled and the liquid flowing through recesses 214.

Under cover 216, the circulation of the liquid within recesses 214 is performed from injection port 218I to discharge port 218O. In the orientation of FIG. 3 where ports 218I and 218O are respectively located on the left-hand side and on the right-hand side of chip 202, the circulation of fluid inside of recesses 214 is symbolized by arrows directed rightwards.

FIG. 3 shows recesses 214 which have, in top view, a rectangular shape. This is however not limiting, and recesses 214 may in practice have any shape in top view.

FIG. 3 further shows recesses 214 which extend longitudinally from a first lateral surface of chip 202 to a second lateral surface of chip 202, opposite to the first surface. This is however not limiting, and recesses 214 may in practice extend longitudinally out of chip 202, that is, within encapsulation block 212. As a variant, recesses 214 do not emerge on the side of the first and second lateral surfaces of chip 202.

Figure 4:
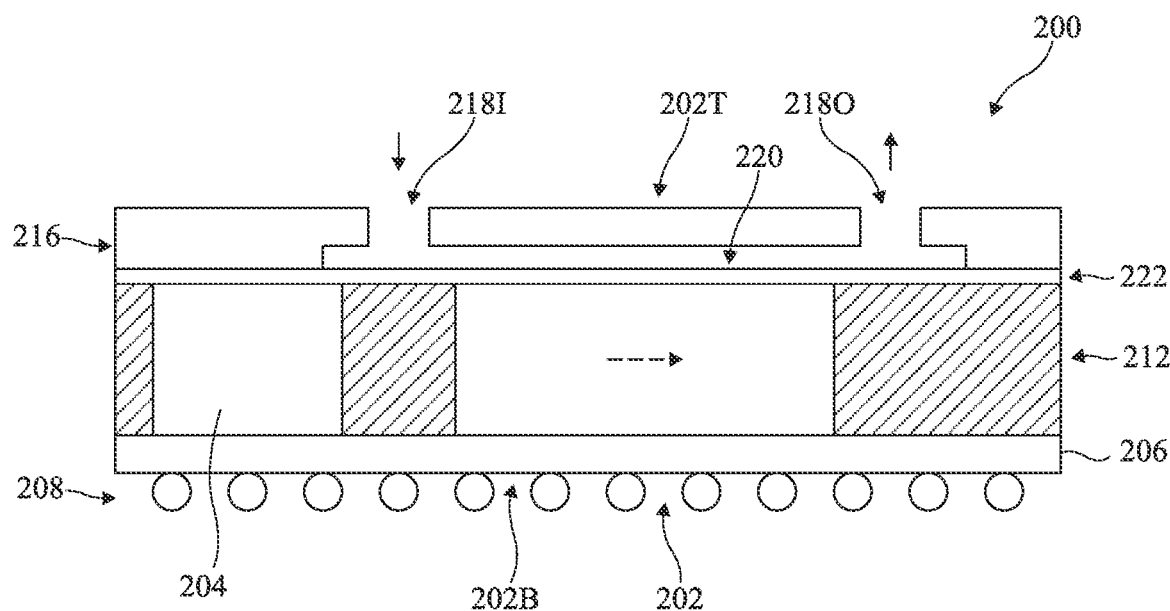
FIG. 4 is a partial simplified cross-section view along plane AA of FIG. 3 of the device of FIG. 2.

FIG. 4 is a partial simplified cross-section view along plane AA of FIG. 3 of the device 200 of FIG. 2. In FIG. 4, encapsulation block 212 is symbolized by hatched areas.

The cavity 220 formed by cover 216 is centered with respect to chip 220 to allow an optimal distribution of the fluid into recesses 214 (FIG. 2). FIG. 4 arbitrarily shows an embodiment where only chip 202 is cooled by the liquid circulation. As a variant, chip 204 is also cooled by the liquid circulation and then for example has, on its upper surface, recesses similar to those of chip 202.

According to an embodiment, cover 216 is bonded, on the upper surface side of encapsulation block 212, to a passivation layer 222 added onto block 212. Layer 222 is for example an oxide layer. As a variant, cover 216 is bonded, on the upper surface side of encapsulation block 212, directly to block 212 (layer 222 being omitted in this case).

Figure 5:
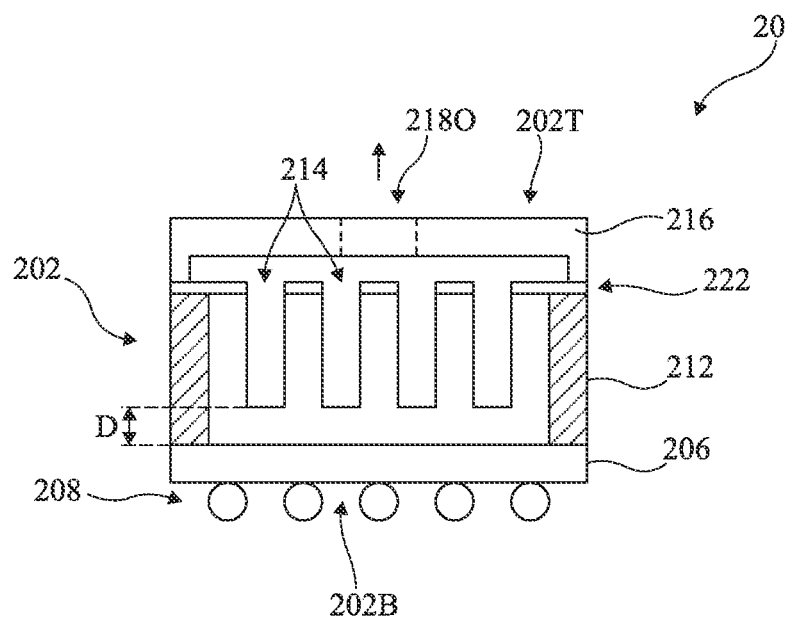
FIG. 5 is another partial simplified cross-section view, along plane BB of FIG. 3 of the device of FIG. 2.

FIG. 5 is another partial simplified cross-section view, along plane BB of FIG. 3, of the device 200 of FIG. 3. In FIG. 5, encapsulation block 212 is symbolized by hatched areas.

Passivation layer 222 is interrupted at the level of recesses 214 to allow the circulation of liquid on the side of upper surface 202T of chip 202.

In FIG. 5, the bottom of each groove-shaped recess 214 is separated from the active surface 202B of chip 202 by a distance noted D. According to an embodiment, distance D is in the range from 20 µm to 250 µm, preferably from 20 µm to 40 µm.

The shorter distance D, the larger the surface area of the lateral surfaces of recesses 214. By decreasing distance D, the surface area of exchange between chip 202 and the fluid is thus increased, which enables to improve the efficiency of the cooling of chip 202.

Further, the shorter distance D, the thinner the portion of chip 202 separating surface 202B from the bottom of each recess 214. Decreasing distance D thus results in decreasing the thermal resistance between the active surface 202B of chip 202 and the heat-transfer fluid, which enables to further improve the efficiency of the cooling of chip 202.

Figure 6:
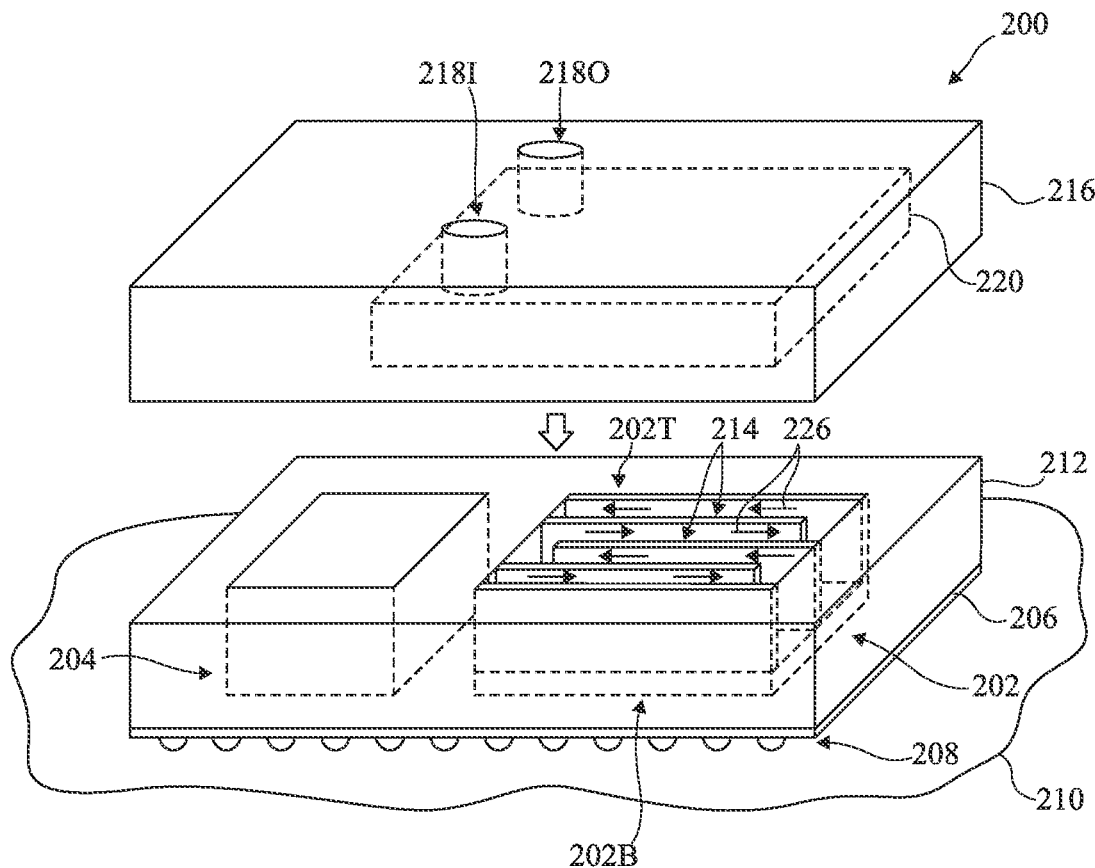
FIG. 6 is a partial simplified perspective view illustrating another embodiment of an electronic device intended to be cooled by the circulation of a liquid.

FIG. 6 is a partial simplified perspective view illustrating another embodiment of an electronic device intended to be cooled by a liquid circulation.

According to this embodiment, chip 202 has, in top view, recesses 214 formed by a coil-shaped groove having its ends respectively located close to ports 218I and 218O. Although this is not shown in FIG. 6, cavity 220 may in this case be omitted to force the fluid to flow (arrows 226) within the coil-shaped channel.

An advantage of the embodiment discussed in relation with FIG. 6 lies in the fact that the forced circulation of the fluid between the fins of chip 202, separated from one another by recesses 214, for example enables to further improve the cooling of chip 202 as compared with the embodiment discussed in relation with FIG. 2.

Figure 7:
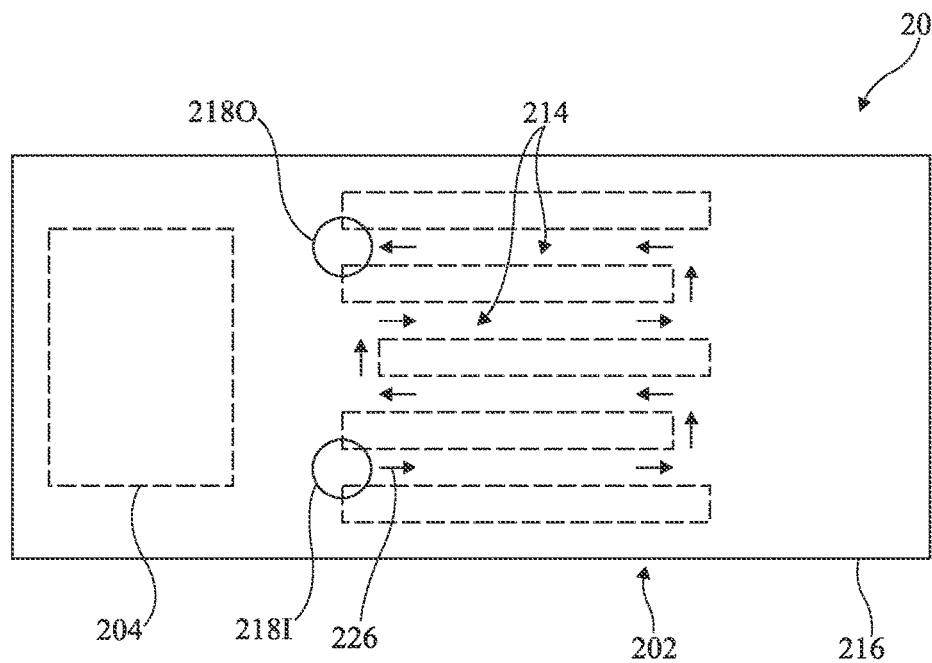
FIG. 7 is a partial simplified top view of the device of FIG. 6.

FIG. 7 is a partial simplified top view of the device of FIG. 6.

In the shown example, the circulation of the fluid, symbolized by arrows 226, follows the coil formed by recesses 214. In practice, cold water is for example injected through inlet port 218I while water progressively heated during its circulation between and in contact with the fins of chip 202 is extracted through outlet port 218O. It can then be ensured, particularly by an appropriate water flow control, that the outlet temperature of the fluid crossing port 218O is smaller than a threshold enabling to reach a desired power for the cooling of chip 202.

Figure 8:
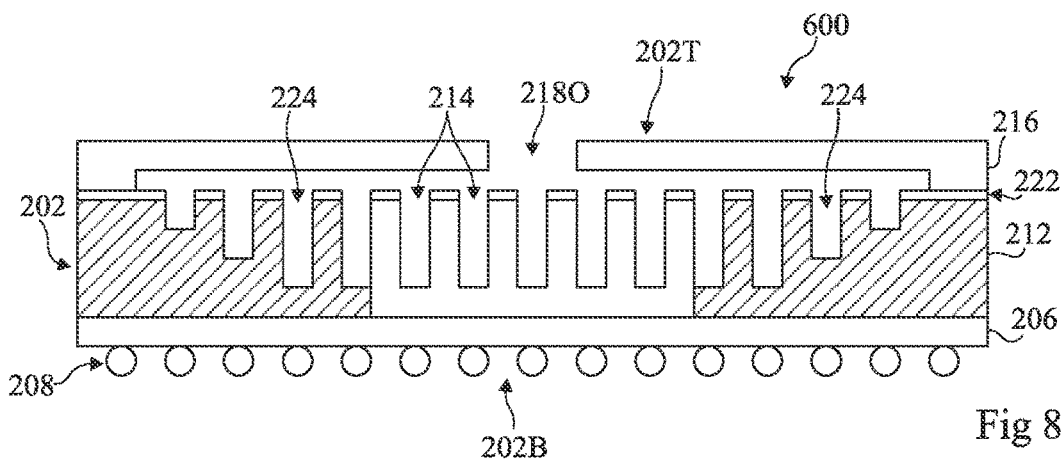
FIG. 8 is a partial simplified cross-section view illustrating another embodiment of an electronic device.

FIG. 8 is a partial simplified cross-section view illustrating another embodiment of an electronic device 600.

The device 600 of FIG. 8 comprises elements common with the device 200 of FIG. 2. These common elements will not be described again hereafter.

The device 600 of FIG. 8 differs from the device 200 of FIG. 2 mainly in that device 600 comprises additional recesses 224 inside of encapsulation block 212. Encapsulation block 212 is symbolized, in FIG. 8, by hatched areas.

Recesses 224, formed from the upper surface of encapsulation block 212, form liquid circulation channels similar to those formed by recesses 214, formed from the upper surface of chip 202. In other words, recesses 224 take part in the cooling of chip 202.

FIG. 8 shows an embodiment where the recesses 224 closest to chip 202 have a greater depth than the recesses 224 most distant from chip 202. This is however not limiting, and recesses 224 may for example all have the same depth.

An advantage of the device 600 of FIG. 8 lies in the fact that the presence of recesses 224 enables to increase the efficiency of the liquid circulation. Recesses 224 particularly enable to limit charge losses by favoring the downward flow of the liquid from input port 281I and the upward flow of the liquid to outlet port 218O.

Figure 9:
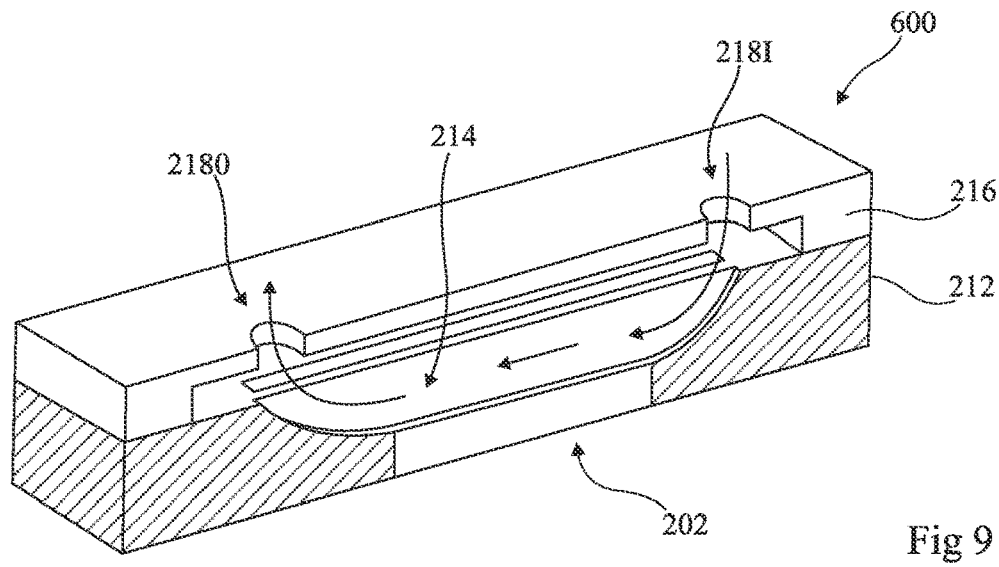
FIG. 9 is a simplified perspective and cross-section view of the device of FIG. 8.

FIG. 9 is a simplified perspective and cross-section view of the device of FIG. 8. More particularly, the cross-section plane of FIG. 9 is perpendicular to the upper surface of cover 216 and runs through the center of the ports 218I and 218O of the device 600 of FIG. 6.

In the shown example, recesses 214 longitudinally extend within encapsulation block 212. Recesses 214 have, in side view, the shape of an arc of a circle in the vicinity of ports 218I and 218O. This particularly allows a better guiding of the liquid flow.

Embodiments where inlet and outlet ports 218I and 218O each have a cylindrical shape with a circular cross-section with their axis oriented perpendicularly to the upper surface of cover 216 have been shown hereabove in relation with FIGS. 2 to 9. This is however not limiting, and the ports may in practice have any shape. In particular, the ports may have the shape of an oblique cylinder, that is, a cylinder having its axis inclined with respect to a normal to the upper surface of cover 216.

As an example, fluid inlet and outlet ports 218I and 218O are not perpendicular to the upper surface of cover 216, that is, the surface of cover 216 having ports 218I and 218O formed therein. Ports 218I and 218O then for example form an angle in the range from 45° to 70° relative to the normal to the upper surface of cover 216, so that the fluid does not enter and come out perpendicularly to the direction of channels 214. This for example enables to optimize the liquid flow.

Generally, it will be within the abilities of those skilled in the art to adapt the shape of ports 218I and 218O to optimize the guiding of the fluid with respect to the fins of chip 202.

Figure 10:
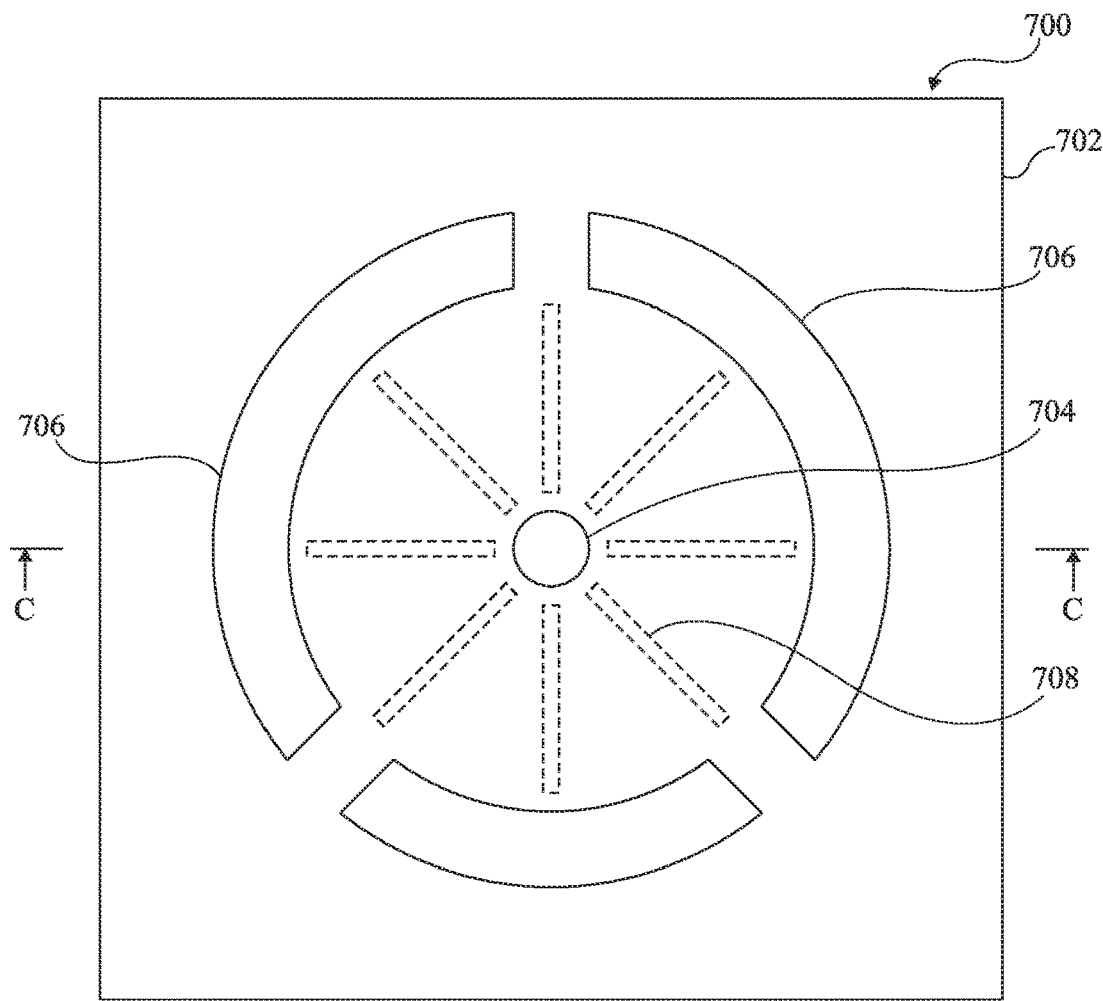
FIG. 10 is a partial simplified top view illustrating still another embodiment of an electronic device.

FIG. 10 is a partial simplified top view illustrating still another embodiment of an electronic device 700.

According to this embodiment, device 700 comprises a cover 702 through which are formed:

a central port 704 intended to allow an injection of heat-transfer liquid into a region located under cover 702; and peripheral ports 706, in the form of a ring sector or portion, intended to allow the discharge of the heat-transfer liquid from the region located under cover 702.

Under cover 702, the circulation of the heat-transfer liquid is guided by fins 708. Fins 708 are arranged radially, so that one end of each fin is located close to central portion 704 while the other end of each fin is located close to one of peripheral ports 706. Fins 708 thus define channels, in the form of a disk sector, for the flowing of liquid from injection port 704 to discharge ports 706.

Figure 11:
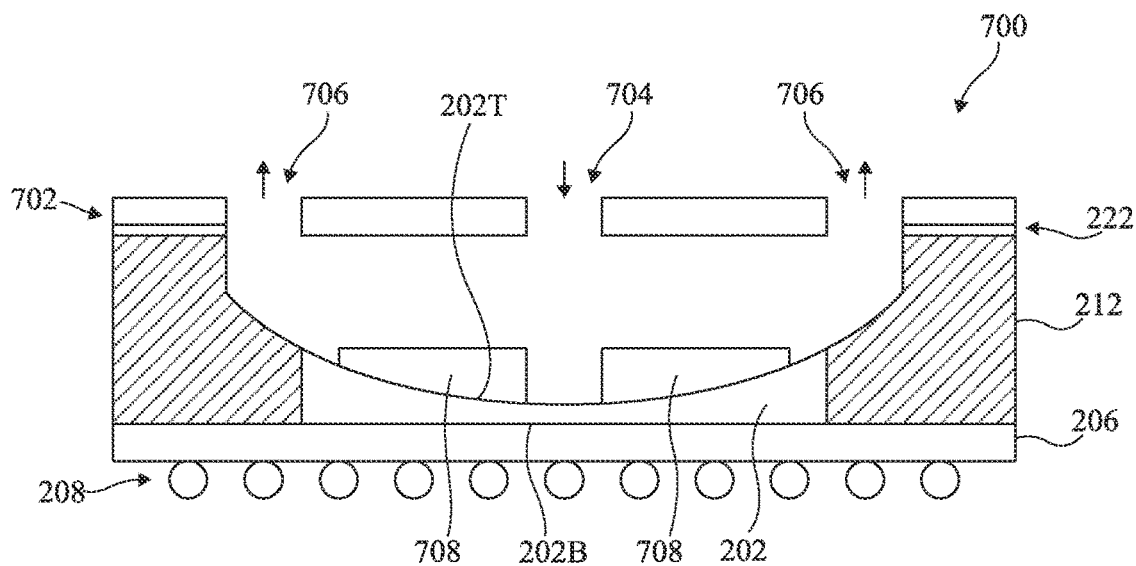
FIG. 11 is a partial simplified cross-section view, along plane CC of FIG. 10, of the device of FIG. 10.

FIG. 11 is a partial simplified cross-section view, along plane CC of FIG. 10, of device 700.

The device 700 of FIGS. 10 and 11 comprises elements common with the device 200 of FIG. 2. These common elements will not be described again hereafter.

The device 700 of FIGS. 10 and 11 differs from the device 200 of FIG. 2 mainly in that, in device 700, chip 202 comprises recesses in the form of a disk sector, each recess being laterally delimited by two fins 708.

According to the embodiment shown in FIG. 11, the upper surface 202T of chip 202 has the shape of a spherical cap open at the top. In other words, surface 202T has, in cross-section view, the shape of an arc of a circle. This enables to ensure that the thickness of chip 202 is smaller at the center than on the sides. This mainly enables to improve the liquid circulation. This is also useful, for example, in the case where components located in the middle of the active surface 202B of chip 202 are desired to be more particularly cooled.

FIGS. 12 to 18 hereafter describe successive steps of an implementation mode of a method of manufacturing the electronic device 200 of FIG. 2.

Figure 12:
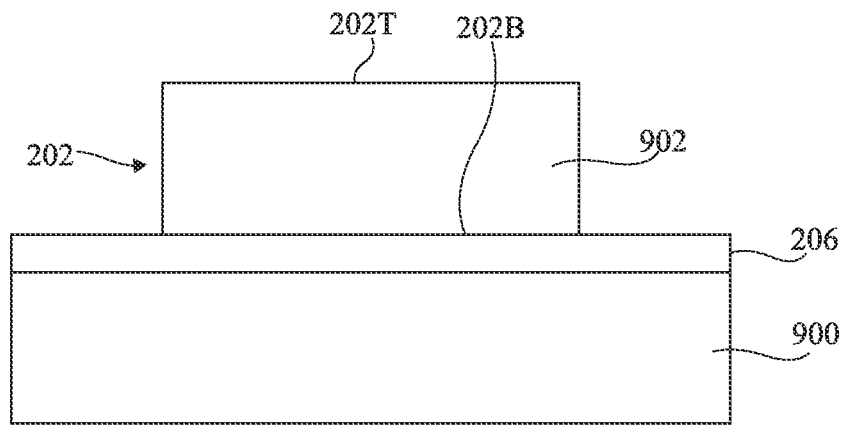
FIG. 12 is a partial simplified cross-section view illustrating a step of an implementation mode of an electronic device manufacturing method.

FIG. 12 is a partial simplified cross-section view illustrating a step of the implementation mode of the method of manufacturing electronic device 200.

During this step, electronic chips 202 and 204 (only chip 202 is shown in the cross-section view of FIG. 12) are transferred onto a support or handle 900.

It is considered, for simplification, that handle 900 has already been submitted to previous operations (not detailed) aiming at forming, on its upper surface side, the interconnection structure 206 such as described in relation with FIG. 2. During the transfer onto handle 900, chip 202 is placed into contact, by its active surface 202B, with the upper surface of interconnection structure 206.

According to an embodiment, chip 202 is formed inside and on top of a semiconductor substrate 902. Chip 202 may particularly be obtained at the end of an operation of cutting or sawing of a wafer made of a semiconductor material, for example, made of silicon, inside and on top of which active electronic components have been formed. The surface 202B of chip 202 corresponds to the surface of substrate 902 inside and on top of which the active electronic components have been formed.

As an example, substrate 902 has a thickness in the range from 700 nm to 800 nm, for example, equal to 740 nm.

Handle 900 is for example made of a semiconductor material, of a polymer material, or of glass.

Figure 13:
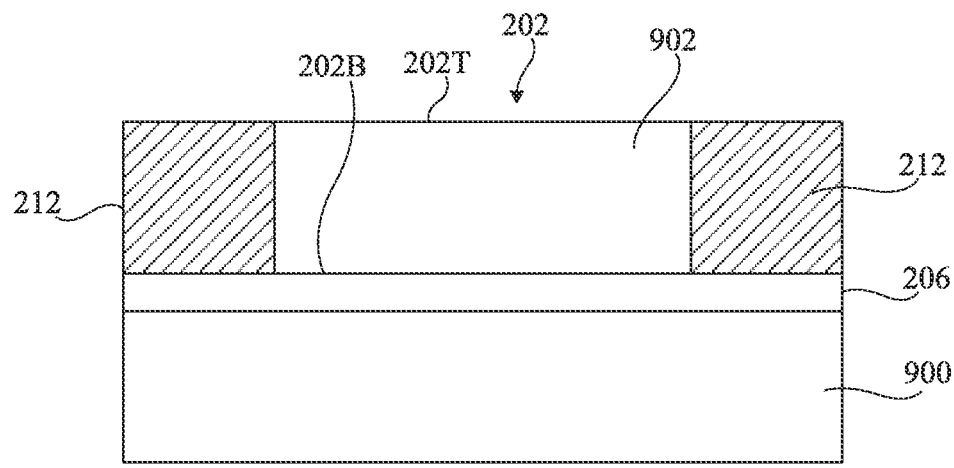
FIG. 13 is a partial simplified cross-section view illustrating another step of the implementation mode of the electronic device manufacturing method.

FIG. 13 is a partial simplified cross-section view illustrating another step of the implementation mode of the method of manufacturing device 200.

During this step, the encapsulation block 212 surrounding the lateral surfaces of chip 202 is formed.

Block 212 is preferably obtained from an epoxy resin layer deposited on free portions of the upper surface of interconnection structure 206. The resin layer is for example deposited in such a way as to cover chip 202. The resin layer is then thinned to expose the upper surface of 202T of chip 202, and then planarized. As illustrated in FIG. 13, an encapsulation block 212 having an even upper surface, flush with the upper surface of chip 202, is thus obtained.

In FIGS. 13 to 18, encapsulation block 212 is symbolized by hatched areas.

Figure 14:
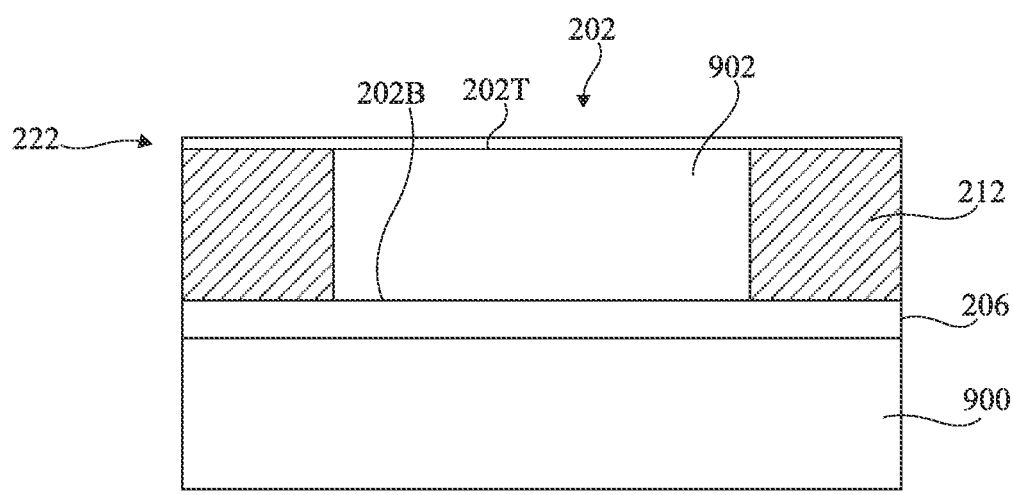
FIG. 14 is a partial simplified cross-section view illustrating still another step of the implementation mode of the electronic device manufacturing method.

FIG. 14 is a partial simplified cross-section view illustrating still another step of the implementation mode of the method of manufacturing device 200.

During this step, oxide layer 222 is deposited on the upper surface side of the structure obtained at the end of the previous step.

Layer 22 more particularly coats the upper surface of encapsulation block 212 and the upper surface 202T of chip 202. Layer 222 is for example intended to protect encapsulation block 212 from humidity. Layer 222 is for example called barrier layer, or hard mask.

Figure 15:
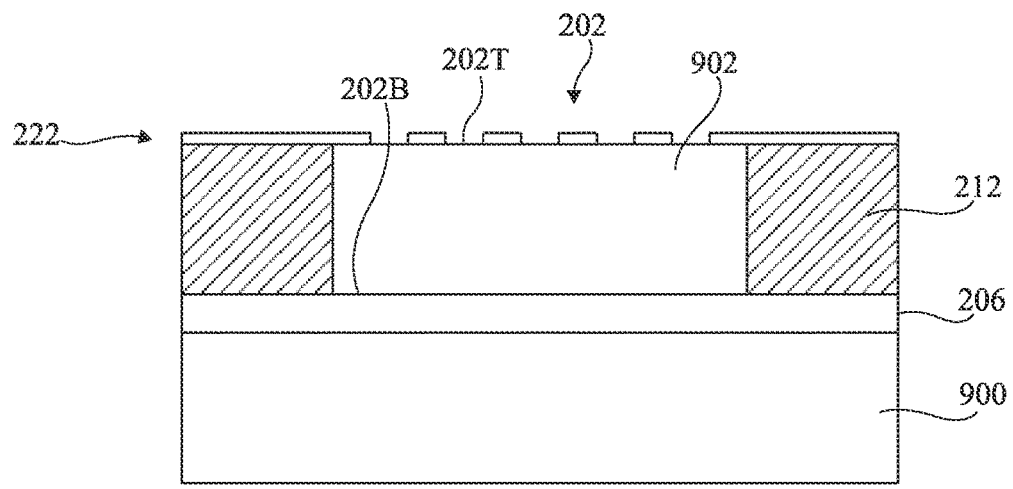
FIG. 15 is a partial simplified cross-section view illustrating still another step of the implementation mode of the electronic device manufacturing method.

FIG. 15 is a partial simplified cross-section view illustrating still another step of the implementation mode of the method of manufacturing device 200.

During this step, layer 222 is etched to expose portions of the upper surface 202T of chip 202.

The operation of etching of layer 222 is for example performed by photolithographic etching. In particular, it may be provided to coat layer 222 with a layer (not shown) of positive or negative resist, to illuminate this resist through a mask, and then to remove illuminated (in the case of positive resist) or non-illuminated (in the case of negative resist) portions of the resist layer. Portions of upper surface 202T of chip 202 are then exposed by etching portions of layer 222 which are not covered with the photolithography resist, after which the remaining photolithography resist is removed.

During this step, it may additionally be provided to perform similar operations to expose upper surface portions of encapsulation block 212.

Figure 16:
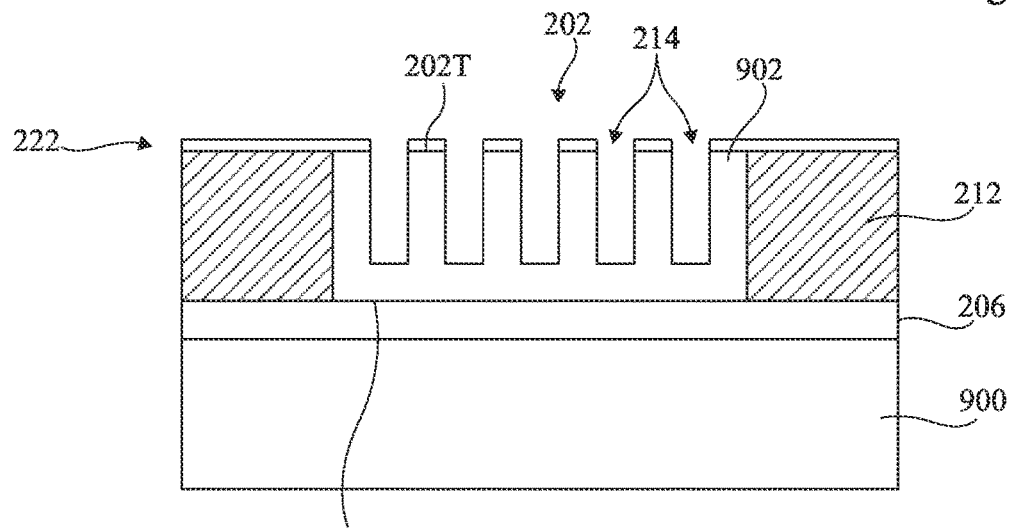
FIG. 16 is a partial simplified cross-section view illustrating still another step of the implementation mode of the electronic device manufacturing method.

FIG. 16 is a partial simplified cross-section view illustrating still another step of the implementation mode of the method of manufacturing device 200.

During this step, the upper surface 202T of chip 202 is etched to form recesses 214.

Recesses 214 are more particularly formed by etching chip 202 upstream of the front surface portions 202T which are not covered with the portions of layer 222 that remain at the end of the previous step. Grooves or furrows are thus formed in substrate 902, these grooves being open on the side of upper surface 202T of chip 202.

According to a preferred embodiment, recesses 214 are formed by reactive ion etching (REI), for example, by deep reactive ion etching (DRIE).

In the case (not shown) where upper surface portions of encapsulation block 212 have been exposed at the end of the previous step, an etching of encapsulation block 212 may further be performed vertically in line with upper surface portions of block 212 which are not covered with layer 222. Recesses similar to the recesses 214 described in relation with FIG. 8 are thus for example formed. The etching of encapsulation block 212 is preferably performed with a laser. This for example enables to individually control the depth of each recess 224 (FIG. 8).

Figure 17:
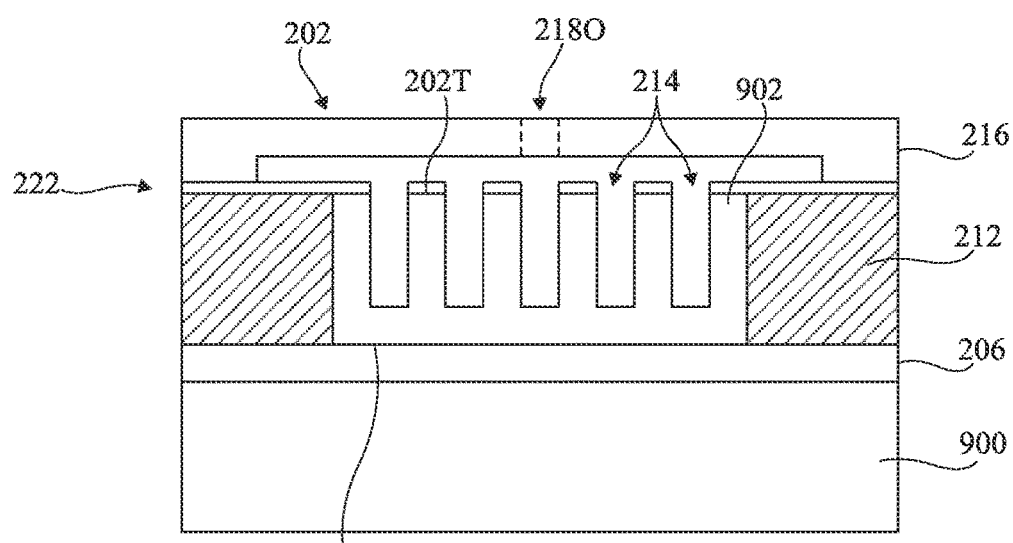
FIG. 17 is a partial simplified cross-section view illustrating still another step of the implementation mode of the electronic device manufacturing method.

FIG. 17 is a partial simplified cross-section view illustrating still another step of the implementation mode of the method of manufacturing device 200.

During this step, cover 216 is transferred onto the upper surface side of the structure obtained at the end of the previous step.

Cover 216 is for example bonded to the portions of layer 222 which remain on either side of chip 202. According to an implementation mode, cover 216 is made of an organic material, preferably an epoxy resin. Cover 216 is for example molded prior to its transfer onto the side of upper surface 202T of chip 202.

Figure 18:
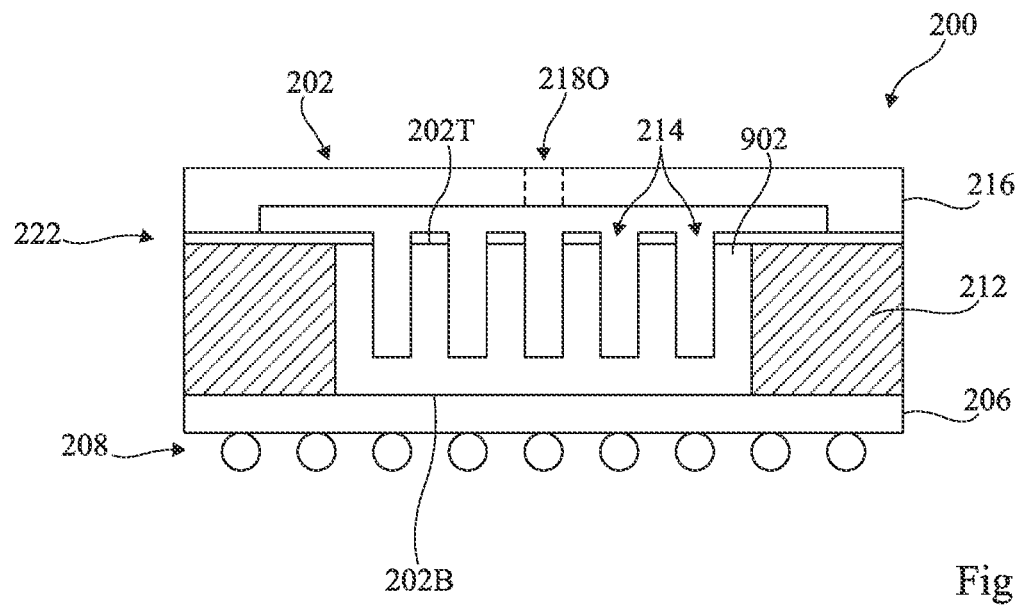
FIG. 18 is a partial simplified cross-section view illustrating still another step of the implementation mode of the electronic device manufacturing method.

FIG. 18 is a partial simplified cross-section view illustrating still another step of the implementation mode of the method of manufacturing device 200.

During this step, handle 900 is removed and array 208 of solder balls is formed on the lower surface side of interconnection structure 206.

Handle 900 is for example separated from interconnection structure 206 by heating.

An implementation mode of a method of manufacturing a single device 200 has been described hereabove in relation with FIGS. 12 to 18. However, in practice, this method may advantageously be implemented to simultaneously form any number of devices 200, for example, several tens of devices 200. In particular, it may be provided to transfer a plurality of chips 202 onto a same handle 900 then formed, for example, of an entire wafer. The respective lateral surfaces of chips 202 are then preferably separated by portions of encapsulation block 212. In this case, the covers 216 of all the devices 200 formed on handle 900 may advantageously be obtained from a same piece.

Figure 19:
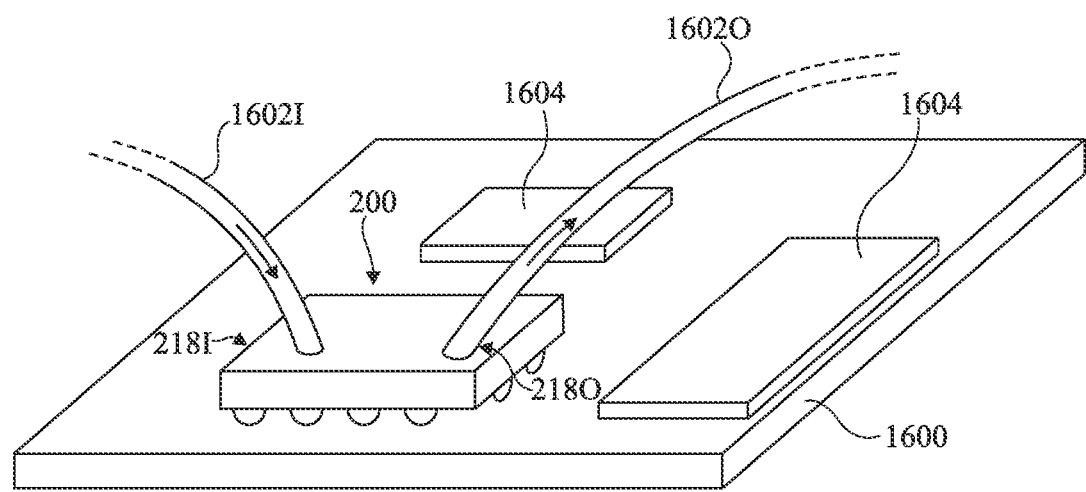
FIG. 19 is a partial simplified perspective view of a printed circuit board comprising a liquid-cooled electronic device.

FIG. 19 is a partial simplified perspective view of a printed circuit board 1600 comprising a liquid-cooled electronic device, for example, device 200.

In the shown example, the liquid injection port 218I of device 200 is connected to a water inlet pipe 1602I. Similarly, the liquid discharge port 218O of device 200 is connected to a water outlet pipe 1602O. Pipes 1602I and 1602O enable to impose a water circulation within device 200. Pipes 1602I and 1602O, for example, capillaries, have dimensions adapted to the size of device 200 and of its ports 218I and 218O.

The presence, in device 200, of a chip 202 comprising recesses 214 (FIG. 2) enables to improve the efficiency of the cooling of device 200 over a device which would comprise a chip equipped with a usual heat sink. This for example enables to operate the chip 202 of device 200 at a higher frequency and/or under a stronger electric current. In the case, for example, of a supercomputer comprising several thousands, or even several ten or hundred thousands, of boards 1600, this may further enable to decrease the energy consumption linked to the cooling of the supercomputer.

As an example, board 1600 may comprise other electronic devices schematized, in FIG. 19, as parallelepipeds 1604. Certain devices 1604 may for example be cooled with water, like device 200, while other devices 1604 are for example cooled with air.

Various embodiments, implementation modes, and variants have been described. Those skilled in the art will understand that certain features of these various embodiments, implementation modes, and variants, may be combined and other variants will occur to those skilled in the art.

In particular, although an implementation mode of a method of manufacturing a device comprising groove—shaped recesses has been more particularly described, the adaptation of this implementation mode to the manufacturing of devices comprising other types of recesses, particularly recesses in the form of a disk sector, is within the abilities of those skilled in the art based on the above indications.

Finally, the practical implementation of the described embodiments, implementation modes, and variants is within the abilities of those skilled in the art based on the functional indications given hereabove. In particular, the selection of the location and of the geometry of the recesses according to the chip 202 to be cooled is within the abilities of those skilled in the art.

What is claimed is:

1. System comprising:
    an electronic chip formed on top and inside of a semiconductor substrate comprising, one the side of a first surface, at least one active component and, on the side of a second surface opposite to the first surface, at least one channel for the circulation of a liquid intended to cool the chip; and
    a block made of an organic material surrounding the chip on all its lateral surfaces, the block comprising at least one second channel for the circulation of a liquid.

2. System according to claim 1, wherein each first channel is defined by a recess from the second surface of the substrate.

3. System according to claim 2, wherein each recess has the shape of a straight groove open on the side of the second surface of the substrate.

4. System according to claim 3, wherein the bottom of each groove is separated from the first surface of the substrate by a distance (D) in the range from 20 μm to 250 μm, preferably from 20 μm to 40 μm.

5. System according to claim 1, wherein the first channel has, in top view, a coil shape.

6. System according to claim 2, wherein each recess has the shape of a disk sector laterally bordered with two radial fins.

7. Electronic device comprising:
    a system according to claim 1; and
    a cover located opposite the second surface of the substrate.

8. Device according to claim 7, wherein the cover forms a space for distributing the liquid into each channel.

9. Device according to claim 7, wherein the cover comprises a liquid injection port and a liquid discharge port.

10. Device according to claim 9, wherein each first channel has a first end located close to the liquid injection port and a second end located close to the liquid discharge port.

11. Device according to claim 9, wherein the liquid injection port and the liquid discharge port form, with respect to a normal to the upper surface of the cover, an angle in the range from 45° to 70°.

12. Device according to claim 7, wherein the cover is made of an organic material, preferably epoxy resin.

13. Method of manufacturing a device according to claim 7, comprising the steps of:
    depositing an oxide layer on the second surface of the substrate;
    etching the oxide layer;
    forming the first circulation channel vertically in line with a portion of the second surface of the substrate which is not coated with the oxide layer; and
    bonding the cover opposite the second surface of the substrate.

14. Method according to claim 13, wherein the first circulation channel is formed by reactive ion etching.

* * * * *